United States Patent (10) Patent No.: US 11,812,581 B2
Takeuchi et al. (45) Date of Patent: Nov. 7, 2023

(54) COOLING STRUCTURE AND ELECTRICAL APPARATUS

(71) Applicants: KABUSHIKI KAISHA TOYOTA JIDOSHOKKI, Kariya (JP); NIDEC CORPORATION, Kyoto (JP)

(72) Inventors: Takashi Takeuchi, Kariya (JP); Toshiaki Ito, Kariya (JP); Yoshiaki Oshita, Kariya (JP); Hidehiko Hidaka, Kyoto (JP); Shigeyuki Moriya, Kyoto (JP)

(73) Assignees: KABUSHIKI KAISHA TOYOTA JIDOSHOKKI, Kariya (JP); NIDEC CORPORATION, Kyoto (JP)

( * ) Notice: Subject to any disclaimer, the term of this patent is extended or adjusted under 35 U.S.C. 154(b) by 0 days.

(21) Appl. No.: 17/788,962

(22) PCT Filed: Dec. 21, 2020

(86) PCT No.: PCT/JP2020/047713
§ 371 (c)(1),
(2) Date: Jun. 24, 2022

(87) PCT Pub. No.: WO2021/132171
PCT Pub. Date: Jul. 1, 2021

(65) Prior Publication Data
US 2023/0040072 A1 Feb. 9, 2023

(30) Foreign Application Priority Data
Dec. 26, 2019 (JP) ................... 2019-236324

(51) Int. Cl.
*H05K 7/20* (2006.01)
(52) U.S. Cl.
CPC ..... *H05K 7/20154* (2013.01); *H05K 7/20172* (2013.01)

(58) Field of Classification Search
CPC ............. H05K 7/20154; H05K 7/20172
See application file for complete search history.

(56) References Cited

U.S. PATENT DOCUMENTS 6,053,242 A * 4/2000 Hsieh ............... H01L 23/467
257/E23.099
2021/0151875 A1* 5/2021 Samardzija ............. H01Q 1/48

FOREIGN PATENT DOCUMENTS

JP 10-145079 A 5/1998

OTHER PUBLICATIONS

International Search Report for PCT/JP2020/047713, dated Mar. 9, 2021.

* cited by examiner

*Primary Examiner* — Mukundbhai G Patel
(74) *Attorney, Agent, or Firm* — Sughrue Mion, PLLC

(57) ABSTRACT

A cooling structure includes: a main body including a base, and heat dissipation fins and a protrusion that protrude from a heat dissipation surface; a lid member disposed to cover the protrusion and the fins and form a flow path; and a fan mechanism. The fan mechanism includes a vane portion, a driving portion that rotates the vane portion, and a conductive wire for supplying electric power to the driving portion. The protrusion includes a first through hole, and the base includes a second through hole communicating with the first through hole. The conductive wire includes a first portion connected to the driving portion and disposed between the lid member and the main body, and a second portion continuing from the first portion and inserted in the first through hole and the second through hole. The cooling structure enables enhancement of the heat dissipation and shielding performance.

8 Claims, 4 Drawing Sheets

COOLING STRUCTURE AND ELECTRICAL APPARATUS

CROSS REFERENCE TO RELATED APPLICATIONS

This application is a National Stage of International Application No. PCT/JP2020/047713 filed Dec. 21, 2020, claiming priority based on Japanese Patent Application No. 2019-236324 filed Dec. 26, 2019.

TECHNICAL FIELD

The present description relates to a cooling structure and an electrical apparatus.

BACKGROUND ART

As disclosed in Japanese Patent Laying-Open No. H10-145079 (PTL 1), an electrical apparatus has various devices (heat sources) contained in a case. The case is equipped with a cooling structure for the purpose of dissipating heat. The cooling structure disclosed in PTL 1 includes a fan mechanism. A fan cover is disposed to cover a fan motor and, on the inner side of the fan cover, a shield member is disposed annularly along the inner wall of the fan cover. A harness is connected to the fan motor.

CITATION LIST

Patent Literature

PTL 1: Japanese Patent Laying-Open No. H10-145079

SUMMARY

Technical Problem

In the cooling structure disclosed in PTL 1, only the fan is provided as main heat dissipation means, and there remains a room for improvement in terms of enhancement of the heat dissipation performance. Moreover, the harness connected to the fan motor is substantially entirely exposed inside the fan cover, and there remains a room for improvement in terms of enhancement of the shielding performance.

The present description aims to disclose a cooling structure having a configuration that enables enhancement of both the heat dissipation performance and the shielding performance, as well as an electrical apparatus having such a cooling structure.

Solution to Problem

A cooling structure based on the present disclosure includes: a main body that includes a base in which a heat dissipation surface is formed, a plurality of heat dissipation fins each protruding from the heat dissipation surface and extending in a height direction from a bottom end located on a side of the heat dissipation surface toward a top end, and a protrusion formed of an electrically conductive member and protruding in the height direction from the heat dissipation surface, and releases, through the heat dissipation surface and the plurality of heat dissipation fins, heat received from a heat source; a lid member including an air inlet, disposed to cover the protrusion and the plurality of heat dissipation fins from a side of the top end, and forming a flow path, together with the heat dissipation surface and the plurality of heat dissipation fins; and a fan mechanism that is driven to rotate and thereby generate an airflow with its upstream side at the air inlet and its downstream side at the flow path. The lid member includes a portion disposed to cover at least the protrusion, and the portion has electrical conductivity. The fan mechanism includes a vane portion, a driving portion that rotates the vane portion, and a conductive wire for supplying electric power to the driving portion. The protrusion includes a first through hole. The base includes a second through hole communicating with the first through hole. The conductive wire includes a first portion connected to the driving portion and disposed between the lid member and the main body, and a second portion continuing from the first portion and inserted in the first through hole and the second through hole.

An electrical apparatus based on the present disclosure includes a case and a heat source contained in the case, and the case is equipped with the above-described cooling structure based on the present disclosure.

Advantageous Effects

With the configuration disclosed herein, a cooling structure having a configuration that enables enhancement of both the heat dissipation performance and the shielding performance, as well as an electrical apparatus equipped with such a cooling structure can be obtained.

DESCRIPTION OF EMBODIMENTS

Figure 1:
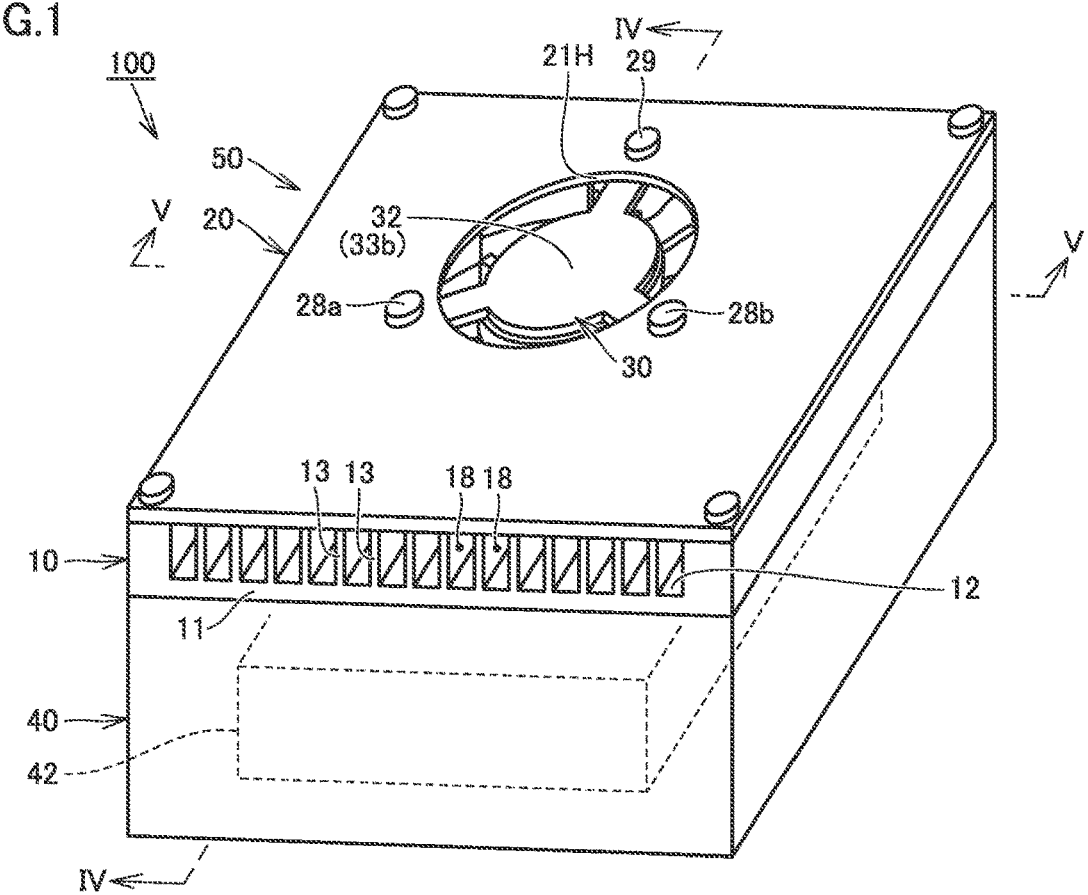
FIG. 1 is a perspective view showing an electrical apparatus 100 equipped with a cooling structure 50 according to Embodiment 1.

Embodiments of the present disclosure are described hereinafter with reference to the drawings. In the following description, the same parts and corresponding parts are denoted by the same reference numerals, and a description of the same or corresponding parts may not be repeated.

Embodiment 1

Electrical Apparatus 100

FIG. 1 is a perspective view showing an electrical apparatus 100 having a cooling structure 50. The electrical apparatus 100 includes a case 40 and a heat source 42 contained in the case 40. The heat source 42 is made up of various devices, and driven to generate heat. The case 40 is equipped with the cooling structure 50 for the purpose of heat dissipation.

Cooling Structure 50

Figure 2:
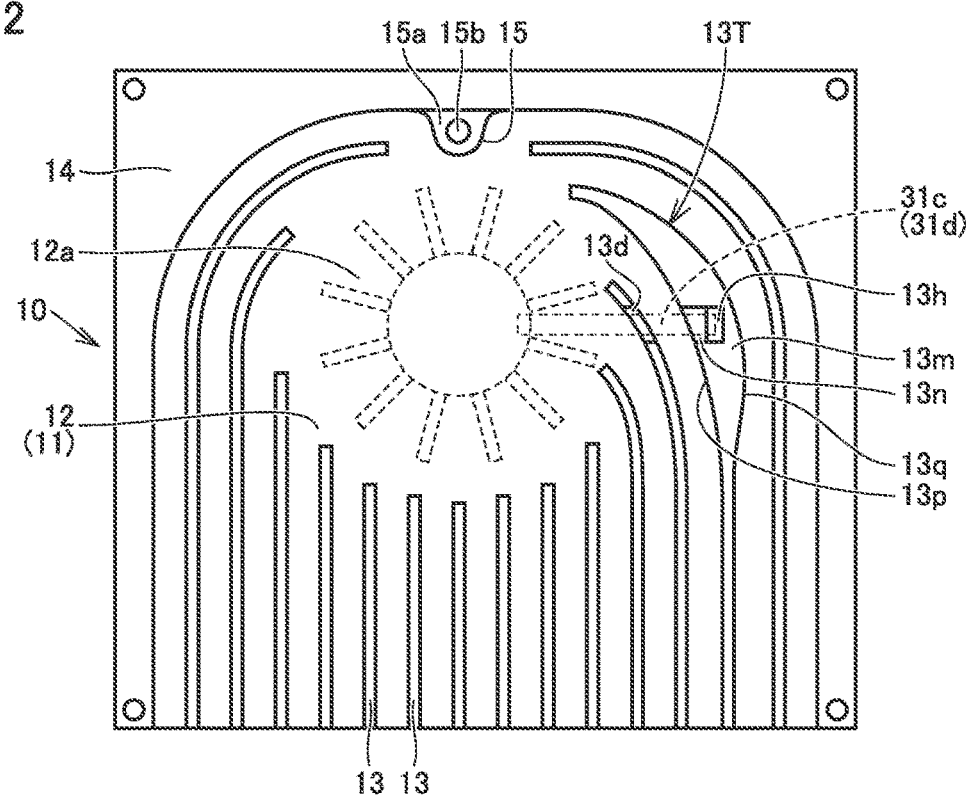
FIG. 2 is a plan view showing a main body 10 of the cooling structure 50 according to Embodiment 1.
Figure 3:
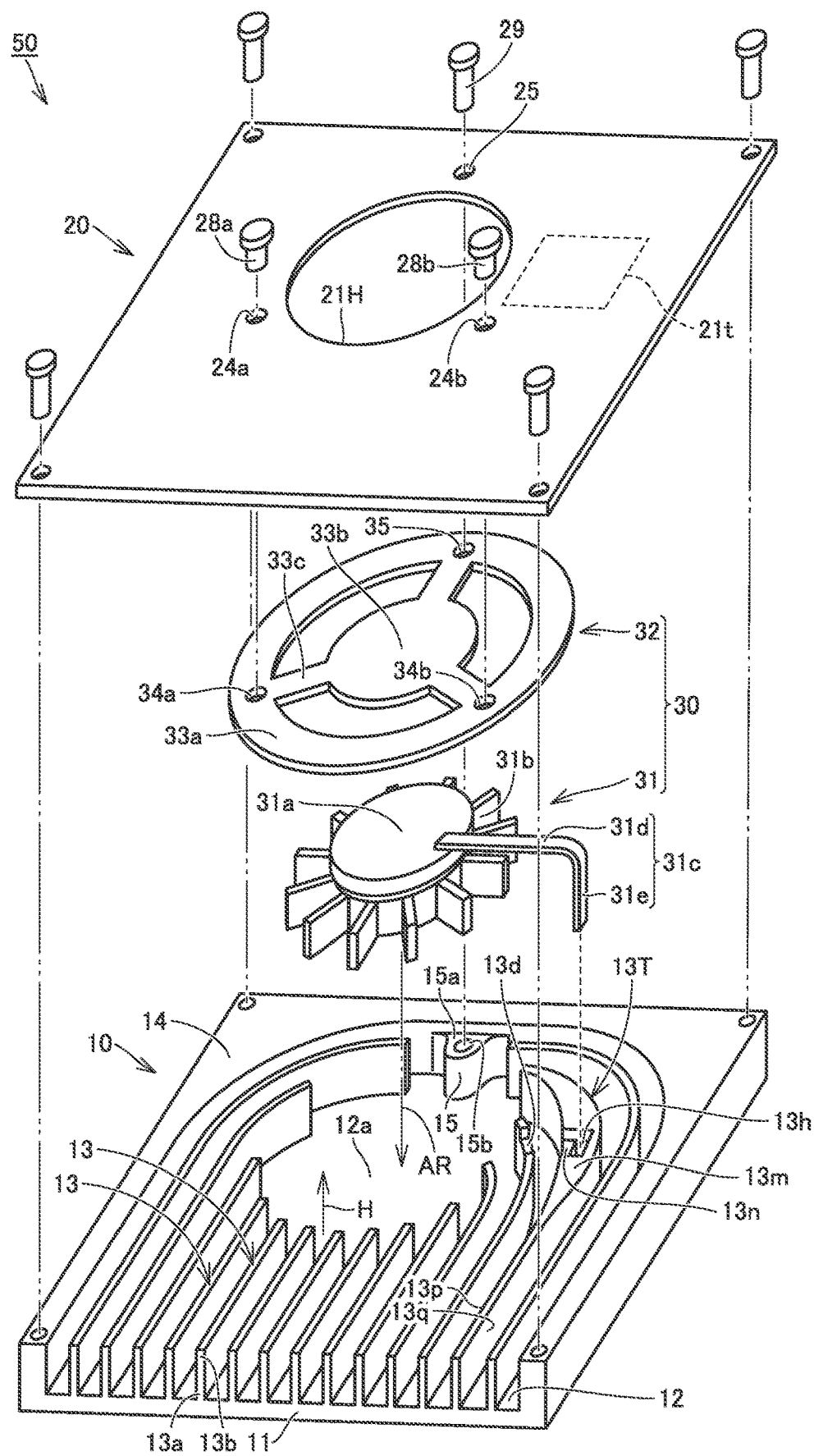
FIG. 3 is a perspective view showing the cooling structure 50 in an exploded state according to Embodiment 1.
Figure 4:
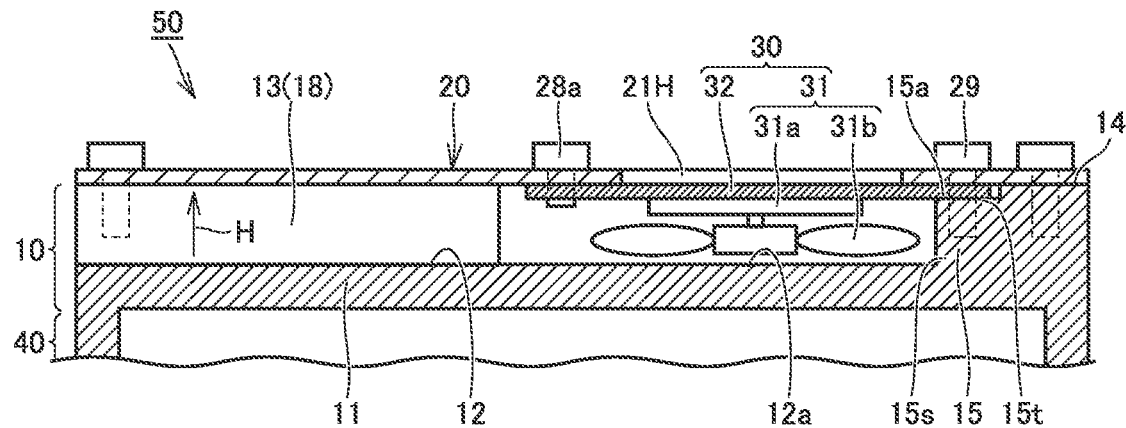
FIG. 4 is a cross-sectional view along a line IV-IV in FIG. 1 as seen in the direction of the arrow, showing a cross-sectional structure of the cooling structure 50 according to Embodiment 1.
Figure 5:
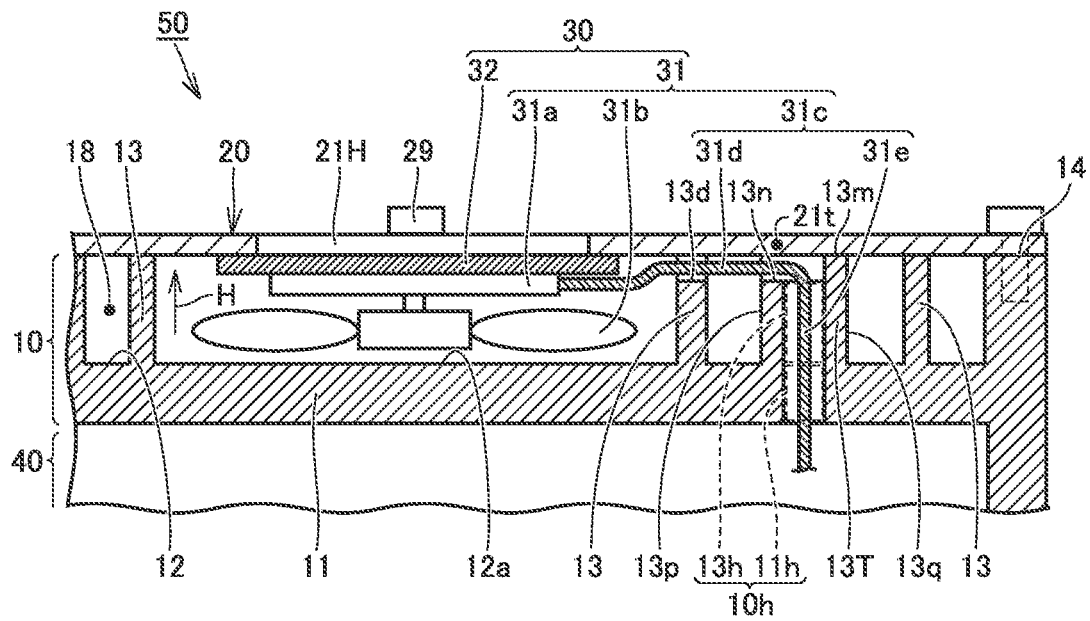
FIG. 5 shows a cross-sectional view along a line V-V in FIG. 1 as seen in the direction of the arrow, showing another cross-sectional structure of the cooling structure 50 according to Embodiment 1.

FIG. 2 is a plan view showing a main body 10 of the cooling structure 50. FIG. 3 is a perspective view showing the cooling structure 50 in an exploded state. FIG. 4 is a cross-sectional view along a line IV-IV in FIG. 1 as seen in the direction of the arrow, and FIG. 5 is a cross-sectional view along a line V-V in FIG. 1 as seen in the direction of the arrow. As shown in FIGS. 1 to 5 (mainly FIG. 3), the cooling structure 50 includes the main body 10, a lid member 20, and a fan mechanism 30.

Main Body 10

The main body 10 includes a base 11 in a flat plate shape, a plurality of heat dissipation fins 13 arranged to stand upright on the base 11, and a protrusion 13T arranged to stand upright on the base 11. A surface of the base 11 (a surface of the base 11 located at an end in the thickness direction of the base 11) forms a heat dissipation surface 12 (FIG. 4).

The protrusion 13T has a side surface 13p and a side surface 13q opposite to the side surface 13p. The protrusion 13T and a plurality of heat dissipation fins 13 protrude from the heat dissipation surface 12, and each extend, in the height direction H (FIG. 3), from a bottom end 13a (FIG. 3) located on a side of the heat dissipation surface 12 toward a top end 13b. The height direction H is herein also the thickness direction of the base 11. On the base 11, a relatively large part extending substantially in a U shape as seen in plan view is also disposed along three sides of the base 11. An inner surface in the U shape formed on this part also forms a flow path 18 described later herein, and therefore, this part may also serve as a heat dissipation fin 13.

At least one of a plurality of heat dissipation fins 13 (the at least one heat dissipation fin is herein a heat dissipation fin 13 next to the protrusion 13T) has a recess 13d on the side of its top end. In the recess 13d, a first portion 31d of a conductive wire 31c described later herein is disposed (FIGS. 3 and 5).

The protrusion 13T is formed of an electrically conductive member. The entire base 11 including the protrusion 13T may be formed of an electrically conductive member. The protrusion 13T in the present embodiment forms the flow path 18. In other words, the protrusion 13T or the present disclosure may serve as a heat dissipation fin. In the protrusion 13T, a first through hole 13h (FIG. 5) located between the side surfaces 13p and 13q and extending in the height direction H is formed. In the present embodiment, the protrusion 13T has a head surface 13m located on the side of the top end and a stepped surface 13n disposed at a height position lower than the head surface 13m in the height direction H (FIGS. 3 and 5). The first through hole 13h is disposed to extend through the stepped surface 13n. In the base 11, a second through hole 11h is formed. The second through hole 11h extends in the height direction H and communicates with the first through hole 13h. The first through hole 13h and the second through hole 11h are coaxially arranged to form a single through hole 10h (FIG. 5).

The heat dissipation surface 12 includes a flat region 12a in which the protrusion 13T and a plurality of heat dissipation fins 13 are not located, and the protrusion 13T and these heat dissipation fins 13 are disposed to partially or entirely surround the periphery of the flat region 12a (see FIG. 2). "A flat region 12a in which the protrusion 13T and a plurality of heat dissipation fins 13 are not located" herein does not include the lower surface of flow paths separated from each other by these elongate heat dissipation fins 13. As seen in plan view, the flat region 12a has a surface area larger than that of the lower surface (the surface formed by the heat dissipation surface 12) of the flow paths separated from each other by these heat dissipation fins 13, and larger than that of a fan main body 31 of the fan mechanism 30 described later herein.

An upper surface 14 (FIG. 3) of the main body 10 forms a flat surface. Screw holes are located at respective four corners of the upper surface 14. The upper surface 14 is a surface of the U-shaped part (heat dissipation fins 13) disposed upright along the outer peripheral edge of the base 11, and the upper surface 14 is opposite to the base 11. The upper surface 14 is a surface extending in a direction crossing the direction from the bottom end 13a toward the top end 13b of the heat dissipation fin 13, and forms the top end 13b. It is not indispensable that the screw holes of the upper surface 14 be located in a part of the main body 10 that serves as a heat dissipation fin. The screw holes may be located in any position in the main body 10, and the screw holes may be located in a part that does not serve as a heat dissipation fin.

The main body 10 further includes a boss 15 protruding in the height direction H from the heat dissipation surface 12. Like the heat dissipation fin 13, the boss 15 protrudes from the heat dissipation surface 12 and extends in the height direction H from a bottom end 15s (FIG. 4) located on a side of the heat dissipation surface 12 toward a top end 15t. To the boss 15, a seating 32 described later herein is fastened. The boss 15 has an upper end surface 15a (specifically a surface extending in a direction crossing the direction from the bottom end 15s toward the top end 15t of the boss 15 and forming the top end 15O is located at a position lower than the position of the upper surface 14 in the height direction H. A screw hole 15b is located in the upper end surface 15a.

Heat generated from the heat source 42 (FIG. 1) in the case 40 is transferred to the base 11. The main body 10 receives the heat from the heat source 42 through the base 11, and releases the heat through the heat dissipation surface 12, the protrusion 13T, and a plurality of heat dissipation fins 13. The main body 10 and the case 40 may be formed as separate parts and the main body 10 may be attached to the case 40. The main body 10 may also be formed integrally with the case 40 in advance, as one of constituent parts of the case 40.

Lid Member 20

The lid member 20 has a flat plate shape, and is fastened to the main body 10. The lid member 20 is disposed to cover a plurality of heat dissipation fins 13 from a side of the top end 13b, and thus the lid member 20 forms a plurality of flow paths 18 (FIG. 1), together with the heat dissipation surface 12 and a plurality of heat dissipation fins 13. The lid member 20 is disposed to cover the protrusion 13T from the side of the top end 13b, and thus flow paths 18 (FIG. 1) are also formed on both sides of the protrusion 13T. The side surfaces 13p, 13q of the protrusion 13T form the flow paths 18, together with the lid member 20 and the heat dissipation surface 12. The protrusion 13T may also serve as a heat dissipation fin. The lid member 20 includes a portion 21t (FIGS. 3 and 5) disposed to cover at least the protrusion 13T, and the portion 21t has electrical conductivity. The entire lid member 20 including the portion 21t may be formed of an electrically conductive member.

Through holes are formed in the outer peripheral edge (four corner positions) of the lid member 20. Fasteners are inserted in respective through holes and screwed into respective screw holes at the four corners of the main body 10. In this way, the lid member 20 is fastened to the main body 10 (FIG. 1). Note that the number "four" (four corners) is given herein by way of example, and the number may be any that is more than one, such as three or five. The outer shape of the lid member 20 is not limited to a rectangular shape, but may be any shape such as polygonal shape, elliptical shape, or circular shape.

An air inlet 21H is formed substantially at the center of the lid member 20 to extend through the lid member 20. Around the air inlet 21H, through holes 24a, 24b, and 25 are formed in the lid member 20. Fasteners 28a, 28b, and 29 are inserted respectively in the through holes 24a, 24b, and 25, and the fasteners 28a, 28b, and 29 are used to fasten the seating 32 of a fan mechanism 30 to the lid member 20, of which details are given later herein.

Fan Mechanism 30

The fan mechanism 30 has the fan main body 31 and the seating 32, and is fastened to the lid member 20. The fan main body 31 includes a vane portion 31b, a driving portion 31a causing the vane portion 31b to rotate, and the conductive wire 31c for supplying electric power to the driving portion 31a. In the state where the lid member 20 is fastened to the main body 10, the vane portion 31b is disposed to face the flat region 12a of the heat dissipation surface 12 (see an arrow AR in FIG. 3). In the height direction H (FIG. 4), the driving portion 31a and the vane portion 31b are disposed between the lid member 20 and the heat dissipation surface 12. The periphery of the fan main body 31 (particularly the vane portion 31b) is surrounded by the protrusion 13T and a plurality of heat dissipation fins 13.

The conductive wire 31c is formed of a flat cable having a strip shape, for example. The technical concept of the flat cable also includes an FPC (Flexible Printed Circuits) and a conductive wire member formed (shaped) in a strip shape, for example. The conductive wire 31c includes the first portion 31d and a second portion 31e. The first portion 31d is connected to the driving portion 31a, extends radially outward from the driving portion 31a, and is disposed between the lid member 20 and the main body 10 (FIGS. 3 and 5). The first portion 31d is disposed to pass between the lid member 20 and the stepped surface 13n. Further, the first portion 31d is also disposed to pass between the lid member 20 and the recess 13d. The second portion 31e continues from the first portion 31d, and is inserted in the first through hole 13h and the second through hole 11h. The end of the second portion 31e that is opposite to the first portion 31d is connected to a controller or the like (not shown) in the case 40.

The vane portion 31b is driven to rotate and thereby generate an airflow with its upstream side at the air inlet 21H (FIG. 1) and its downstream side at the flow paths 18 (FIG. 1). The fan main body 31 may be configured as a centrifugal fan or the like (as sirocco fan or turbo fan, for example) that is capable of sucking air through the air inlet 21H, in the direction of the rotational axis of the vane portion 31b, and efficiently discharging the air outward in the rotational radius direction (toward the side where a plurality of heat dissipation fins 13 are arranged).

The seating 32 is formed of a thin plate-like member, holds the fan main body 31, and attaches the fan main body 31 to the lid member 20. The seating 32 includes an annular outer peripheral portion 33a, a central portion 33b disposed inside the outer peripheral portion 33a, and three connecting portions 33c. The three connecting portions 33c extend in the radial direction from the central portion 33b and connect the central portion 33b to the outer peripheral portion 33a. Note that the number "three" is given herein by way of example, and the number may be any such as two or four. The driving portion 31a of the fan main body 31 is fastened to the central portion 33b.

In the outer peripheral portion 33a of the seating 32, screw holes 34a, 34b and a through hole 35 are formed. The fasteners 28a, 28b are inserted respectively in the through holes 24a, 24b of the lid member 20, and screwed respectively into the screw holes 34a, 34b of the seating 32. The fastener 29 is inserted in the through hole 25 of the lid member 20 and the through hole 35 of the seating 32, and screwed into the screw hole 15b of the main body 10 (boss 15). The seating 32 is fastened to the lid member 20 by the fasteners 28a, 28b. The seating 32 is further fastened to the boss 15 of the main body 10 by the fastener 29. The fastener 29 fastens the lid member 20 and the seating 32 together to the boss 15. The seating 32 is held between the lid member 20 and the upper end surface 15a of the boss 15.

Functions and Effects

As shown in FIG. 5, the protrusion 13T having electrical conductivity is disposed to protrude from the base 11 (heat dissipation surface 12), and the first through hole 13h of the protrusion 13T and the second through hole 11h of the base 11 form the through hole 10h (FIG. 5). The first portion 31d of the conductive wire 31c is disposed between the lid member 20 and the main body 10, and the second portion 31e of the conductive wire 31c is inserted in the through hole 10h (first through hole 13h and second through hole 11h). The lid member 20 includes the portion 21t disposed to cover at least the protrusion 13T and the portion 21t has electrical conductivity.

According to PTL 1 (Japanese Patent Laying-Open No. H10-145079), the harness connected to the fan motor is substantially entirely exposed inside the fan cover. The above-described configuration of Embodiment 1 differs from such a configuration of PTL 1, in that most of the conductive wire 31c connected to the driving portion 31a is surrounded by the electrically conductive member, which enables enhancement of the shielding performance. The head surface 13m of the protrusion 13T may desirably be in contact with the portion 21t of the lid member 20, in order to achieve a higher shielding effect. The electrically conductive member employed for providing the shielding performance is not limited to a metal member, but may be a resin member in which metal particles are dispersed, for example.

In the cooling structure 50, heat generated from the heat source 42 (FIG. 1) in the case 40 is transferred to the base 11. The heat is released through the heat dissipation surface 12, the protrusion 13T and a plurality of heat dissipation fins 13. The fan mechanism 30 promotes heat dissipation. The presence of the protrusion 13T and a plurality of heat dissipation fins 13 makes it possible to enhance the heat dissipation performance, relative to that provided by PTL 1 (Japanese Patent Laying-Open No. H10-145079). The side surfaces 13p, 13q of the protrusion 13T also form the flow path 18, and the protrusion 13T can also serve as a heat dissipation fin and therefore can exhibit a higher heat dissipation effect.

The fan mechanism 30 is fastened to the lid member 20 that forms the flow paths 18 (FIG. 1). In contrast, the fan mechanism 30 may be fastened to the main body 10, for example. In such a case, the fan main body 31 is held stably by the main body 10, and therefore, even when the fan main body 31 is driven to rotate, the effect of the rotation is hardly transferred to the lid member 20 and noise or the like due to vibration of the lid member 20 is hardly generated. In contrast, when the fan mechanism 30 is fastened to the lid member 20, rotation of the vane portion 31b is likely to cause vibration of the lid member 20 and thus likely to cause noise or the like due to the vibration of the lid member 20.

As set forth above, in the cooling structure 50 according to Embodiment 1, the seating 32 of the fan main body 31 is fastened to the main body 10 (boss 15) by the fastener 29. Fastened portions disposed at respective four corners of the lid member 20 each form a fixed end and a portion of the seating 32 that is connected to the boss 15 also forms a fixed end. The fan mechanism 30 is held nearly in the state of being supported at its opposite ends, and therefore, even when the vane portion 31b is driven to rotate, the lid member 20 is unlikely to vibrate and thus generation of noise or the like due to vibration of the lid member 20 is effectively suppressed.

As set forth above, in the cooling structure 50, the vane portion 31b of the fan main body 31 is disposed to face the flat region 12a of the heat dissipation surface 12. While it is not indispensable to form the flat region 12a in the base 11 (heat dissipation surface 12), this configuration enables air or the like from the fan main body 31 to impinge against and move radially from the flat region 12a and thereby flow efficiently into the flow paths 18.

As set forth above, in the cooling structure 50, the stepped surface 13n is formed on the protrusion 13T, and the first portion 31d of the conductive wire 31c is disposed to pass between the lid member 20 and the stepped surface 13n. A greater portion of the surface of the first portion 31d is surrounded by the protrusion 13T, which can produce a higher shielding effect. Moreover, the conductive wire 31c can be disposed in the narrow gap between the lid member 20 and the protrusion 13T (stepped surface 13n), which enables reduction of the thickness and the size, for example, of the cooling structure 50. This is applied as well to the recess 13d formed in the heat dissipation fin 13. The conductive wire 31c is disposed along the lid member 20 to pass on the stepped surface 13n and in the recess 13d, and accordingly, hindrance of flow of air or the like through the flow path 18 by the presence of the conductive wire 31c can also be suppressed effectively. The conductive wire 31c is disposed to pass on the stepped surface 13n and in the recess 13d, and accordingly, positional displacement of the conductive wire 31c can also be suppressed.

As set forth above, in the cooling structure 50, the vane portion 31b and the driving portion 31a of the fan main body 31 are disposed between the lid member 20 and the heat dissipation surface 12 in the height direction. While this configuration is not indispensable, employment of this configuration enables an arrangement in which a plurality of heat dissipation fins 13 surround the periphery of the fan main body 31 (the vane portion 31b and the driving portion 31a), for example, and thereby enables reduction of the thickness and the size, for example, of the cooling structure 50. The fact that the conductive wire 31c is formed of a flat cable having a strip shape also enables the conductive wire 31c to be disposed in the narrow gap between the lid member 20 and the heat dissipation surface 12, and thereby enables reduction of the thickness and the size, for example, of the cooling structure 50.

As set forth above, in the cooling structure 50, the main body 10 is provided with the boss 15, and the seating 32 of the fan main body 31 is fastened to the boss 15 by the fastener 29. While it is not indispensable to provide the main body 10 with the boss 15, the presence of the boss 15 easily and simply enables a configuration in which the seating 32 is fastened to the main body 10, i.e., the seating 32 is held between the lid member 20 and the upper end surface 15a of the boss 15 to form a fixed end.

As a fastened portion for fastening the seating 32 to the main body 10, a configuration may be employed in which a bracket or the like suspends from the seating 32 and the bracket is connected to any portion of the base 11 or the heat dissipation surface 12. This configuration also allows the portion of the seating 32 connected to the boss 15 to form a fixed end, and thus generation of noise or the like due to vibration of the lid member 20 is effectively suppressed. As set forth above, in the cooling structure 50, the fastener 29 fastens the lid member 20 and the seating 32 together to the boss 15. Both the configuration in which the lid member 20 is fastened to the boss 15 by a single fastener 29 and the configuration in which the seating 32 is fastened to the boss 15 can thus be implemented.

The seating 32 of the fan main body 31 is fastened to the main body 10 by the fastener 29 (fastener 28a). The fastened portion for fastening the seating 32 to the main body 10 may be implemented through fastening with a bolt, or fastening by means of an adhesive or welding, or implemented by a crimped structure or the like. In other words, a portion of the lid member that is fastened to the main body is a fastened portion. The fastened portion implemented by such a fastener 29, however, is not indispensable, and the seating 32 of the fan main body 31 may be incorporated in the cooling structure in such a manner that the seating 32 is subjected to an urging force applied from the main body 10 to the seating 32.

The height of the boss 15 is made larger. This configuration allows the seating 32 to be held between the lid member 20 and the upper end surface 15a of the boss 15 even in the absence of the fastener 28a (FIG. 6), and allows the fan mechanism 30 to be held nearly in the state of being supported at its opposite ends. Therefore, even when the vane portion 31b is driven to rotate, the lid member 20 is unlikely to vibrate and thus generation of noise or the like due to vibration of the lid member 20 is effectively suppressed. The fastener 28a is not used, which enables reduction of the number of parts.

Embodiment 2

Figure 6:
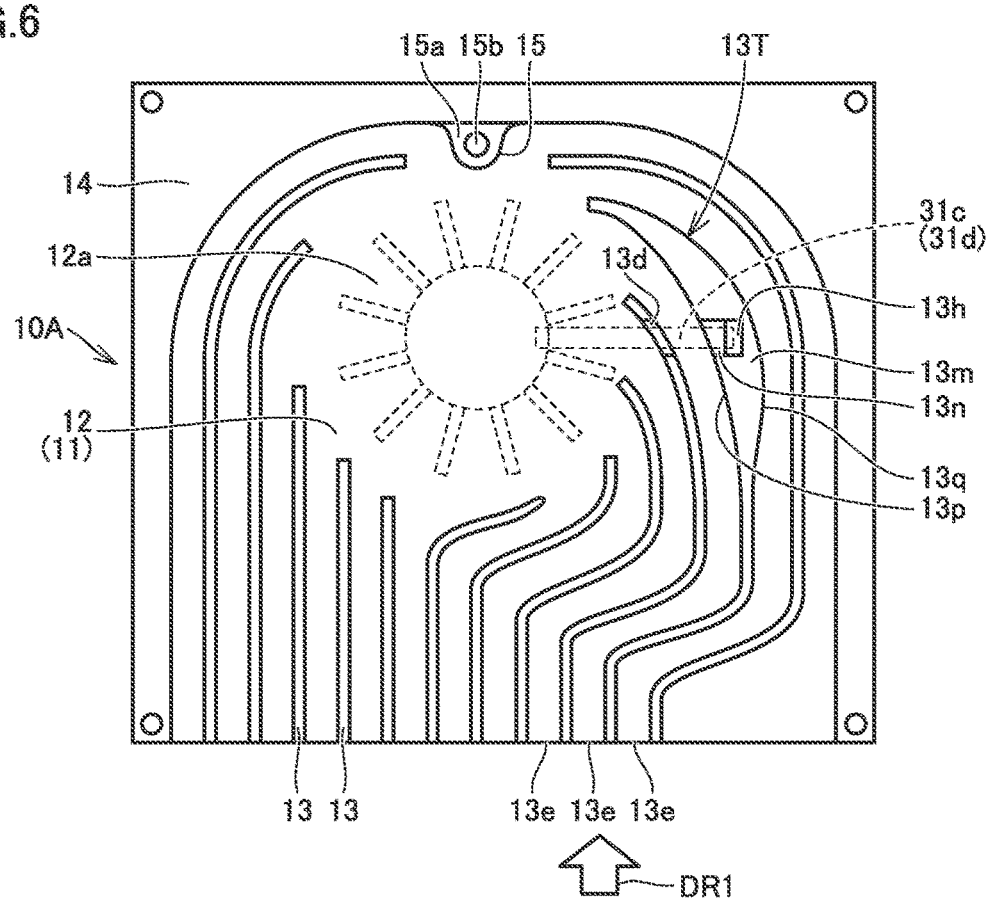
FIG. 6 is a plan view showing a main body 10A of a cooling structure according to Embodiment 2.

FIG. 6 is a plan view showing a main body 10A of a cooling structure according to Embodiment 2. Noise from the conductive wire 31c is likely to be emitted outward from an exit 13e of the flow path 18. Therefore, for the purpose of further improving the shielding performance, the heat dissipation fin 13 and the protrusion 13T may be curved so that it is difficult or impossible to visually recognize the conductive wire 31c from the exit 13e.

It is supposed that the configuration of the heat dissipation fin 13 and the protrusion 13T as shown in FIG. 6 is employed. In this case, even when the conductive wire 31c is to be visually recognized from the exit 13e in the direction of an arrow DR1, for example, it is substantially impossible to visually recognize the conductive wire 31c, because of blockage by the presence of the heat dissipation fin 13 and the protrusion 13T. Such a configuration having the shielding effect can be employed to obtain higher shielding performance.

Embodiment 3

Figure 7:
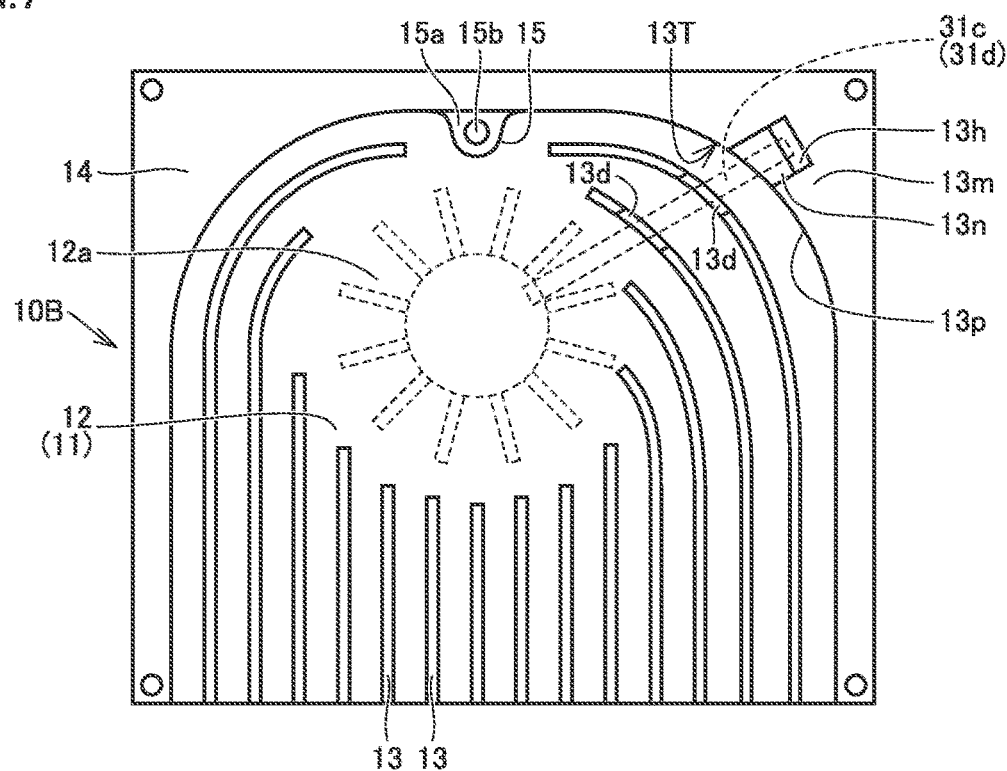
FIG. 7 is a plan view showing a main body 10B of a cooling structure according to Embodiment 3.

FIG. 7 is a plan view showing a main body 10B of a cooling structure according to Embodiment 3. According to above-described Embodiment 1 (FIG. 2), the protrusion 13T serves as a heat dissipation fin. In contrast, for the main body 10B according to Embodiment 3, a protrusion 13T as shown in FIG. 7 is employed.

While the feature that the protrusion 13T protrudes from the base 11 (heat dissipation surface 12) in the height direction H is common to Embodiments 1 and 3 and a side surface 13p of the protrusion 13T forms a flow path 18, the protrusion 13T does not have a fin shape. A head surface 13m of the protrusion 13T is formed by the upper surface 14 of the main body 10. Even when this configuration is employed, functions and effects similar to those of Embodiment 1 as described above can be obtained.

While the embodiments are described hereinabove, the above disclosure is given by way of illustration in all respects, not by way of limitation. It is intended that the technical scope of the present disclosure is defined by claims, and encompasses all modifications and variations equivalent in meaning and scope to the claims.

REFERENCE SIGNS LIST 10, 10A, 10B main body; 10h, 24a, 24b, 25, 35 through hole; 11 base; 11h second through hole; 12 heat dissipation surface; 12a flat region; 13 heat dissipation fin; 13T protrusion; 13a, 15s bottom end; 13b, 15t top end; 13d recess; 13e exit; 13h first through hole; 13m head surface; 13n stepped surface; 13p, 13q side surface; 14 upper surface; 15 boss; 15a upper end surface; 15b, 34a, 34b screw hole; 18 flow path; 20 lid member; 21H air inlet; 21t portion; 28a, 28b, 29 fastener; 30 fan mechanism; 31 fan main body; 31a driving portion; 31b vane portion; 31c conductive wire; 31d first portion; 31e second portion; 32 seating; 33a outer peripheral portion; 33b central portion; 33c connecting portion; 40 case; 42 heat source; 50 cooling structure; 100 electrical apparatus; AR, DR1 arrow; H height direction

The invention claimed is:

1. A cooling structure comprising:
   a main body that includes: a base in which a heat dissipation surface is formed; a plurality of heat dissipation fins each protruding from the heat dissipation surface and extending in a height direction from a bottom end located on a side of the heat dissipation surface toward a top end; and a protrusion formed of an electrically conductive member and protruding in the height direction from the heat dissipation surface, and releases, through the heat dissipation surface and the plurality of heat dissipation fins, heat received from a heat source;
   a lid member including an air inlet, disposed to cover the protrusion and the plurality of heat dissipation fins from a side of the top end, and forming a flow path, together with the heat dissipation surface and the plurality of heat dissipation fins; and
   a fan mechanism that is driven to rotate and thereby generate an airflow with its upstream side at the air inlet and its downstream side at the flow path, wherein
   the lid member includes a portion disposed to cover at least the protrusion, and the portion has electrical conductivity,
   the fan mechanism includes a vane portion, a driving portion that rotates the vane portion, and a conductive wire for supplying electric power to the driving portion,
   the protrusion includes a first through hole,
   the base includes a second through hole communicating with the first through hole, and
   the conductive wire includes a first portion connected to the driving portion and disposed between the lid member and the main body, and a second portion continuing from the first portion and inserted in the first through hole and the second through hole.

2. The cooling structure according to claim 1, wherein
   the protrusion includes a head surface located on the side of the top end, and a stepped surface located at a height position lower than the head surface in the height direction,
   the first through hole is disposed to extend through the stepped surface, and the first portion of the conductive wire is disposed to pass between the lid member and the stepped surface.

3. The cooling structure according to claim 1, wherein
   at least one of the plurality of heat dissipation fins has a recess on the side of the top end, and
   the first portion of the conductive wire is disposed to pass between the lid member and the recess.

4. The cooling structure according to claim 1, wherein a side surface of the protrusion forms the flow path, together with the lid member and the heat dissipation surface.

5. The cooling structure according to claim 1, wherein
   the heat dissipation surface includes a flat region in which the protrusion and the plurality of heat dissipation fins are not located,
   the plurality of heat dissipation fins are disposed to partially or entirely surround a periphery of the flat region, and
   the vane portion is disposed to face the flat region.

6. The cooling structure according to claim 1, wherein the vane portion and the driving portion are disposed between the lid member and the heat dissipation surface in the height direction.

7. The cooling structure according to claim 1, wherein the conductive wire is formed of a flat cable having a strip shape.

8. An electrical apparatus comprising:
   a case; and
   a heat source contained in the case, wherein
   the case is equipped with the cooling structure according to claim 1.

* * * * *